(12) United States Patent
Carlson et al.

(10) Patent No.: US 7,569,926 B2
(45) Date of Patent: Aug. 4, 2009

(54) WAFER LEVEL HERMETIC BOND USING METAL ALLOY WITH RAISED FEATURE

(75) Inventors: Gregory A. Carlson, Santa Barbara, CA (US); David M. Erlach, Santa Barbara, CA (US); Alok Paranjpye, Santa Barbara, CA (US); Jeffery F. Summers, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 434 days.

(21) Appl. No.: 11/304,601

(22) Filed: Dec. 16, 2005

(65) Prior Publication Data

US 2007/0048898 A1     Mar. 1, 2007

Related U.S. Application Data

(63) Continuation-in-part of application No. 11/211,622, filed on Aug. 26, 2005.

(51) Int. Cl.
*H01L 23/12* (2006.01)
(52) U.S. Cl. .................... 257/704; 257/711
(58) Field of Classification Search .............. 257/684, 257/689–711
See application file for complete search history.

(56) References Cited

U.S. PATENT DOCUMENTS

| | | | |
|---|---|---|---|
| 5,534,466 A | 7/1996 | Perfecto et al. | |
| 6,181,569 B1 | 1/2001 | Chakravorty | |
| 6,407,345 B1 | 6/2002 | Hirose et al. | |
| 6,479,320 B1 * | 11/2002 | Gooch | 438/109 |
| 6,486,425 B2 | 11/2002 | Seki | |
| 6,528,874 B1 | 3/2003 | Iijima et al. | |
| 6,580,138 B1 | 6/2003 | Kubena et al. | |
| 6,746,891 B2 | 6/2004 | Cunningham et al. | |
| 6,793,829 B2 * | 9/2004 | Platt et al. | 216/2 |
| 6,818,464 B2 | 11/2004 | Heschel | |
| 6,876,482 B2 | 4/2005 | DeReus | |

(Continued)

OTHER PUBLICATIONS

"RF MEMS and MEMS packaging," M. Hara, et al., Second International Symposium on Acoustic Wave Devices for Future Mobile Communications Systems, Thursday, Mar. 4, 2004, pp. 115-122.

(Continued)

*Primary Examiner*—Savitri Mulpuri
(74) *Attorney, Agent, or Firm*—Jaquelin K. Spong

(57) ABSTRACT

Systems and methods for forming an encapsulated device include a hermetic seal which seals an insulating environment between two substrates, one of which supports the device. The hermetic seal is formed by an alloy of two metal layers, one deposited on a first substrate and the other deposited on the second substrate, along with a raised feature formed on the first or the second substrate. At least one of the metal layers may be deposited conformally over the raised feature. The raised feature penetrates the molten material of the first or the second metal layers during formation of the alloy, and produces a spectrum of stoichiometries for the formation of the desired alloy, as a function of the distance from the raised feature. At some distance from the raised feature, the proper ratio of the first metal to the second metal exists to form an alloy of the preferred stoichiometry.

19 Claims, 11 Drawing Sheets

U.S. PATENT DOCUMENTS

| | | |
|---|---|---|
| 6,917,086 B2 | 7/2005 | Cunningham et al. |
| 6,924,165 B2 * | 8/2005 | Horning et al. ............... 438/48 |
| 2002/0179921 A1 | 12/2002 | Cohn et al. |
| 2003/0104651 A1 | 6/2003 | Kim et al. |
| 2005/0093134 A1 * | 5/2005 | Tarn ........................... 257/706 |
| 2005/0168306 A1 | 8/2005 | Cohn et al. |
| 2005/0250253 A1 * | 11/2005 | Cheung ...................... 438/125 |
| 2006/0125084 A1 * | 6/2006 | Fazzio et al. ................ 257/704 |
| 2006/0208326 A1 * | 9/2006 | Nasiri et al. ................ 257/414 |
| 2007/0035001 A1 * | 2/2007 | Kuhmann et al. ........... 257/680 |
| 2008/0079120 A1 | 4/2008 | Foster et al. |

OTHER PUBLICATIONS

"Copper Metallization of Semiconductor Interconnects—Issues and Prospects", Uziel Landau, Invited Talk, CMP, Symposium, Abstract # 505, Electrochemical Society Meeting, Phoenix, AZ, Oct. 22-27, 2000.

* cited by examiner

WAFER LEVEL HERMETIC BOND USING METAL ALLOY WITH RAISED FEATURE

CROSS REFERENCE TO RELATED APPLICATIONS

This U.S. patent application is a continuation-in-part of U.S. patent application Ser. No. 11/211,622, filed Aug. 26, 2005, which is incorporated by reference in its entirety.

STATEMENT REGARDING FEDERALLY SPONSORED RESEARCH

Not applicable.

STATEMENT REGARDING MICROFICHE APPENDIX

Not applicable.

BACKGROUND

This invention relates to the sealing of microelectromechanical systems (MEMS) devices in an enclosure and the method of manufacture of the sealed enclosure. In particular, this invention relates to the formation of a hermetic seal between a fabrication wafer supporting the MEMS devices, and a lid wafer.

Microelectromechanical systems (MEMS) are devices often having moveable components which are manufactured using lithographic fabrication processes developed for producing semiconductor electronic devices. Because the manufacturing processes are lithographic, MEMS devices may be batch fabricated in very small sizes. MEMS techniques have been used to manufacture a wide variety of sensors and actuators, such as accelerometers and electrostatic cantilevers.

MEMS techniques have also been used to manufacture electrical relays or switches of small size, generally using an electrostatic actuation means to activate the switch. MEMS devices often make use of silicon-on-insulator (SOI) device wafers, which are a relatively thick silicon "handle" wafer with a thin silicon dioxide insulating layer, followed by a relatively thin silicon "device" layer. In the MEMS switches, a thin cantilevered beam of silicon is etched into the silicon device layer, and a cavity is created adjacent to the cantilevered beam, typically by etching the thin silicon dioxide layer to allow for the electrostatic deflection of the beam. Electrodes provided above or below the beam may provide the voltage potential which produces the attractive (or repulsive) force to the cantilevered beam, causing it to deflect within the cavity.

Because the MEMS devices often have moveable components, such as the cantilevered beam, they typically require protection of the moveable portions by sealing the devices in a protective cap or lid wafer, to form a device cavity. The lid wafer may be secured to the device wafer by some adhesive means, such as a low outgassing epoxy. FIG. 1 shows an embodiment of an exemplary epoxy bond in a MEMS assembly 1. To achieve the epoxy bond, a layer of epoxy 20 is deposited on a cap or lid wafer 10, or on the fabrication wafer 30, around the perimeter of the MEMS device 34. The assembly 1 is then heated or the epoxy otherwise cured with wafer 10 pressed against the fabrication wafer 30, until a bond is formed between the cap or lid wafer 10 and the fabrication wafer 30. The bond forms a device cavity 40 which surrounds the MEMS device 34. The assembly 1 may then be diced to separate the individual MEMS devices 34.

SUMMARY

However, the epoxy bond may not be hermetic, such that the gas with which the MEMS device is initially surrounded during fabrication, escapes over time and may be replaced by ambient air. In particular, if the MEMS device is an electrostatic MEMS switch is intended to handle relatively high voltages, such as those associated with telephone signals, the voltages may exceed, for example, about 400 V. For these relatively high voltages, it may be desirable to seal the electrostatic MEMS switch in a high dielectric strength environment, for example, an electrically insulating gas environment, to discourage breakdown of the air and arcing between the high voltage lines. To this end, it may be desirable to seal a high dielectric strength gas or electrically insulating environment such as sulphur hexafluoride ($SF_6$), helium (He) or a freon such as $CCl_2F_2$ or $C_2Cl_2F_4$ within the device cavity. The gas may be chosen to be at least one of substantially thermally insulating and substantially electrically insulating. The insulating environment may also be vacuum or partial vacuum. In order to maintain the environment around the electrostatic MEMS switch, the seal needs to be hermetic.

The systems and methods described here form a hermetic seal between a device wafer and a cap or lid wafer. The seal construction may include an indium layer deposited over a gold layer. The gold and indium layers may be deposited by ion beam sputter deposition, by plating, or sputtering using a shadow mask to define the regions in which the gold and indium layers are to be deposited, for example. The gold and indium layers are then heated to a temperature beyond the melting point of the indium (156 C.°). At this point, the indium melts into the gold and forms an alloy $AuIn_x$. The alloy $AuIn_x$ may have the stoichiometry $AuIn_2$, and may be eutectic, such that it quickly solidifies. The alloy may be impermeable to electrically insulating, or high dielectric permeability gases such as $SF_6$, and therefore may form a hermetic seal. Because indium melts at relatively low temperatures, the hermetic seal is formed at temperatures of only on the order of 150 degrees centigrade. The formation of the seal is therefore compatible with the presence of relatively vulnerable films, such as metal films, which would melt or volatilize at temperatures of several hundred degrees centigrade. The seal formation process also allows stacks of films of various materials (metals, dielectrics, polymers) to be present in the device. Such stacks tend to delaminate and lose functionality at even slightly elevated temperatures. Nonetheless, because the alloy is stable to several hundred degrees centigrade, the seal may maintain its integrity up to these temperatures.

The systems and methods for forming the hermetic seal may therefore include forming a first metal layer on a first substrate around the MEMS device formed on the first substrate, forming a second metal layer on a second substrate, and coupling the first substrate to the second substrate with an alloy of the first metal and the second metal.

The metal layer may be deposited over a rigid raised feature formed on the surface of one substrate, which in turn forms a raised region in the metal layer. This raised region then penetrates the opposing layer of the other metal deposited on the other substrate, thereby ensuring a region relatively rich in composition of metal of the raised feature. For example, if the raised feature is deposited first on the device wafer, followed by conformal deposition of a gold layer, the raised feature produces a corresponding raised feature in the deposited gold layer. When assembling the wafers, the gold protrusion penetrates into the molten layer of the lower melting point metal, here the indium metal, to produce a region which is rich in concentration of the gold. Adjacent to this region will be regions which are indium-rich/gold poor. Between these two regions will occur a region having nearly the exact desired relative concentration of the metals to form the preferred stoichiometry of the alloy.

These and other features and advantages are described in, or are apparent from, the following detailed description.

BRIEF DESCRIPTION OF THE DRAWINGS

Various exemplary details are described with reference to the following figures, wherein.

DETAILED DESCRIPTION

In the systems and methods described here, a MEMS device is encapsulated with a cap or lid wafer. The MEMS device may have been previously formed on, for example, a silicon-on-insulator (SOI) composite substrate, or any other suitable substrate. The sealing mechanism may be a two-metal alloy, which bonds the silicon-on-insulator composite substrate with the cap or lid wafer. The two-metal alloy may have a melting point much higher than the melting point of either of the constituent elements, so that the alloy solidifies quickly upon formation. The alloy may form a hermetic seal, preventing an enclosed gas from leaking out of the enclosed area of the MEMS device. Because the seal is a metal alloy seal, it may also provide electrical continuity between the cap or lid wafer and the device wafer.

Figure 1:
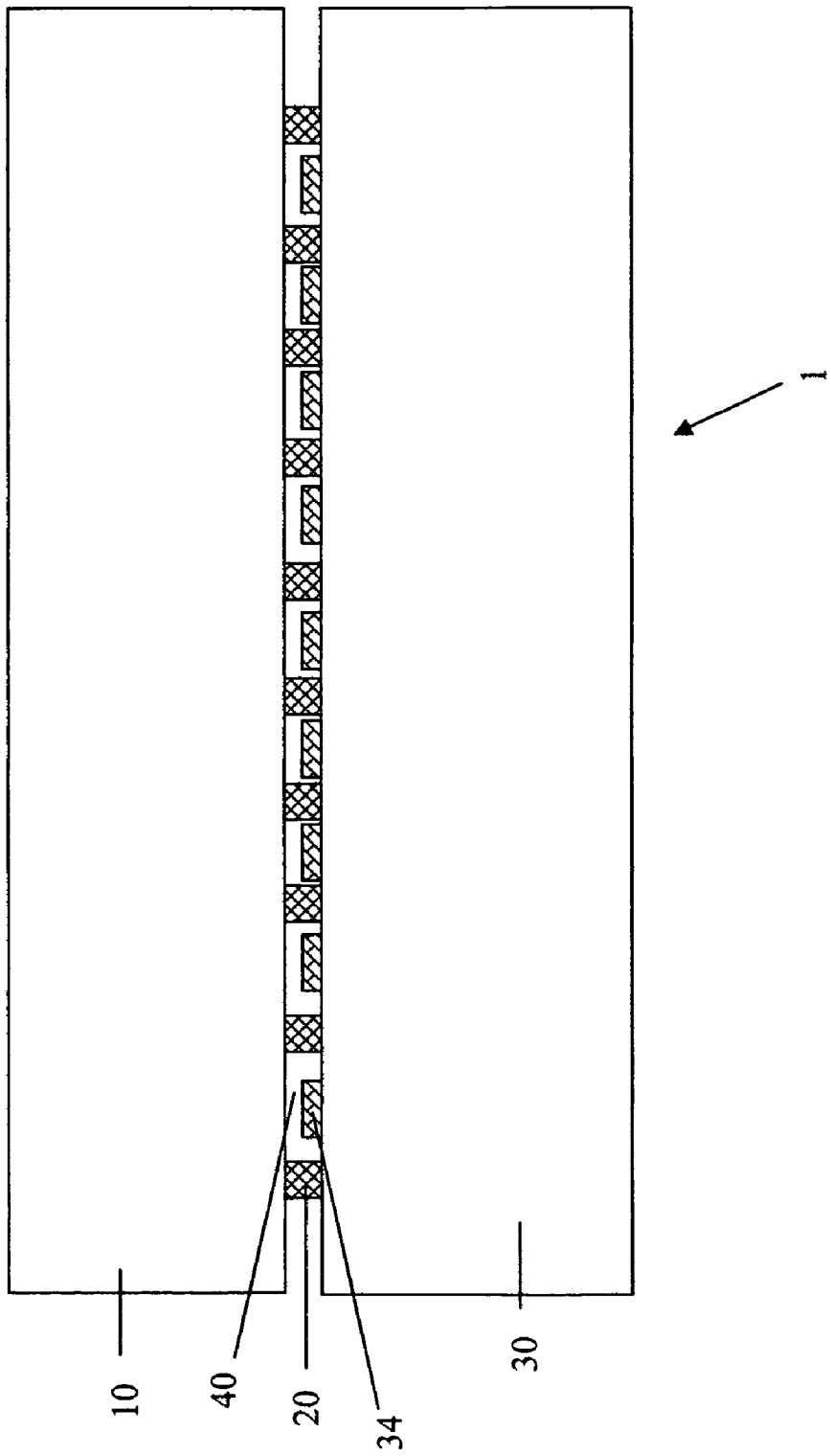
FIG. 1 is a cross sectional view of a prior art epoxy seal.
Figure 2:
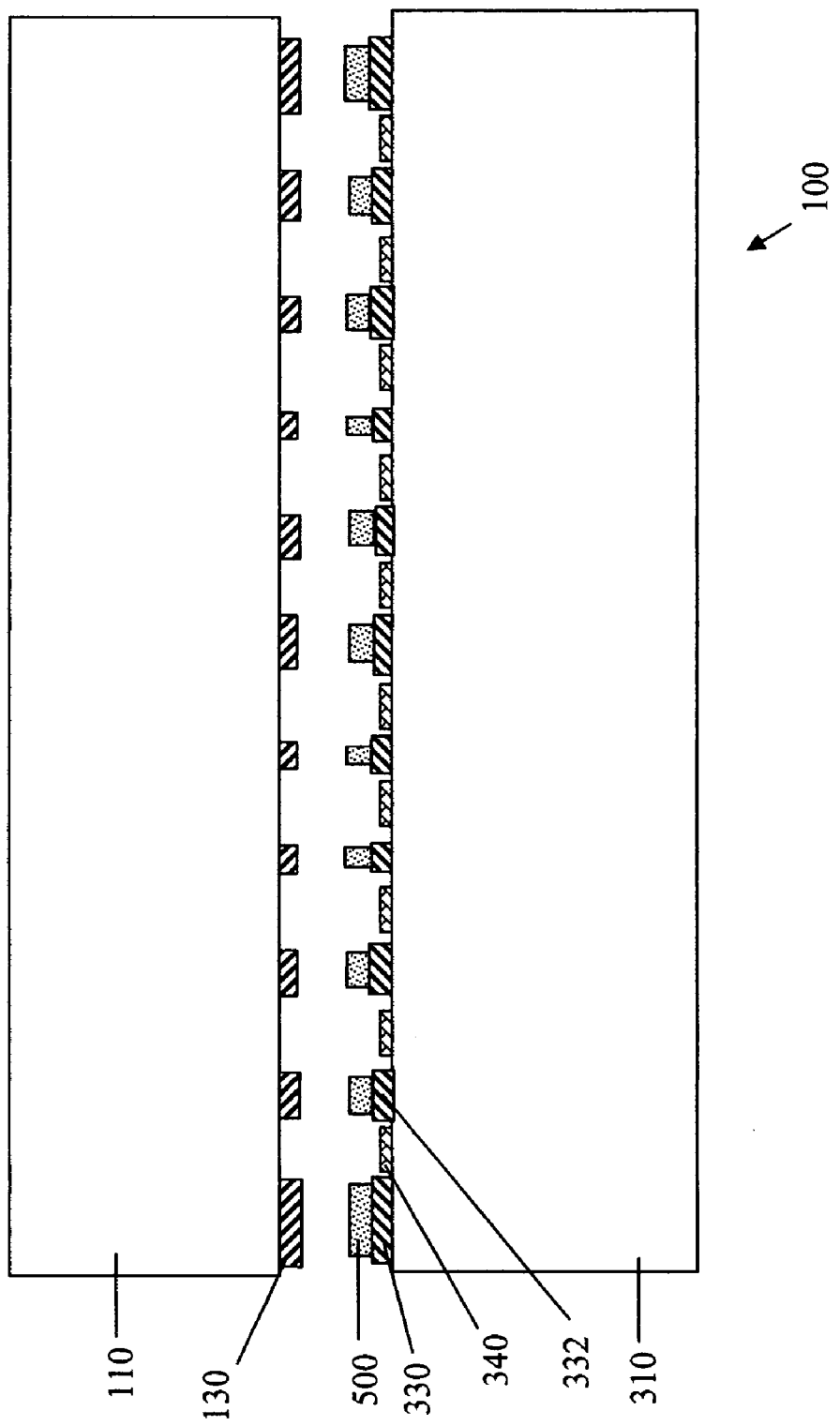
FIG. 2 is a cross sectional view showing an exemplary two-metal hermetic seal.

FIG. 2 shows a cross sectional view of an exemplary two-metal alloy sealed assembly 100 prior to formation of the hermetic seal. As shown in FIG. 2, the assembly 100 may include a first metal layer 130 deposited on a first substrate 110. The first substrate 110 may be a cap or lid wafer. Another metal layer 330 may be deposited on a second substrate 310, where metal layer 330 may be the same metal material as metal layer 130. Another metal layer 500 may be of a second metal material, and may be deposited over metal layer 330 on the second substrate 310. The second substrate 310 may be any suitable substrate, such as a silicon-on-insulator (SOI) substrate, upon which a plurality of MEMS devices 340 have been previously fabricated. Because the details of the MEMS devices are not necessary to the understanding of this invention, the MEMS devices 340 are shown only schematically in FIG. 2, as well as in the figures to follow. It should be understood that while this description pertains to the encapsulation of MEMS devices, the systems and methods disclosed here may be applied to any devices that require encapsulation. The MEMS devices 340 may be located in areas between the metal layers, such as between metal layers 330 and 332 as shown schematically in FIG. 2. The first substrate may be any suitable material, including, for example, amorphous silicon, crystalline silicon, glass, quartz, or sapphire. Metal substrates may also be used, such as Kovar, a nickel-iron-cobalt alloy or Invar, a 36/64 alloy of nickel and iron. Both metals have a coefficient of thermal expansion closely matching that of silicon, which may be advantageous in terms of minimizing stress on the bond between the second substrate 310 and the first substrate 110.

It should be understood that metal layers 130 and 330 may be multilayers, rather than a single layer of metal material. For example, layers 130 and 330 may include an additional layer of metal within layer 130 or 330, to promote adhesion of metal layer 130 or metal layer 330 to substrate 110 or 310, respectively. For example, if the layers 130 and 330 are a gold layers, they may also include a thin layer of chromium (Cr) which promotes adhesion of the gold layers 130 and 330 to the surface of the substrate 110. The chromium layer may be, for example, about 50 Angstroms to about 200 Angstroms in thickness. Furthermore, there may also be diffusion barrier layers present, to prevent the diffusion of the metal of the adhesion layer into metal layer 130 or metal layer 330. For example, the gold layers 130 and 330 may also include a thin layer of molybdenum, about 100 Angstroms in thickness, which prevents the diffusion of the chromium adhesion layer into the gold layer, which would otherwise increase the electrical resistance of the metal layer 130. The remainder of metal layer 130 may be gold, which may be, for example, 3000 Angstroms to about 5000 Angstroms in thickness.

As illustrated in FIG. 2, metal layers 130 and 330 may be made wider than metal layer 500, in order to accommodate the outflow of metal layer 500 when metal layer 500 is heated beyond its melting temperature. For example, metal layers 130 and 330 may be made about 200 μm wide, whereas metal layer 500 may be made only about 80 to about 150 μm wide. Accordingly, when metal layer 500 is melted, and placed under pressure between metal layers 130 and 330, it may flow outward from the bond region. By making metal layers 130 and 330 wider than metal layer 500, the outflow of metal layer 500 may be accommodated while still keeping metal layer 500 between metal layer 130 and metal layer 330.

The surfaces of metal layers 500 and 130 may be cleaned to prepare the surfaces for bonding, and to enhance the strength of the alloy bond. The cleaning procedures may include ion milling of the surfaces, or dipping substrate 110 with metal layer 130, and substrate 310 with metal layers 330 and 500 into a solution of hydrochloric acid (HCl) or nitric acid. The hydrochloric or nitric acid may be used for the removal of the self-passivated metal oxide surface formed over the metal layers 130, 500 and 330. Oxygen plasmas may be used to remove residual photoresist left over from the previous processing, or any other organics which may otherwise interfere with the formation of the alloy bond. The oxygen plasma treatment may be performed before the acid dip.

Figure 3:
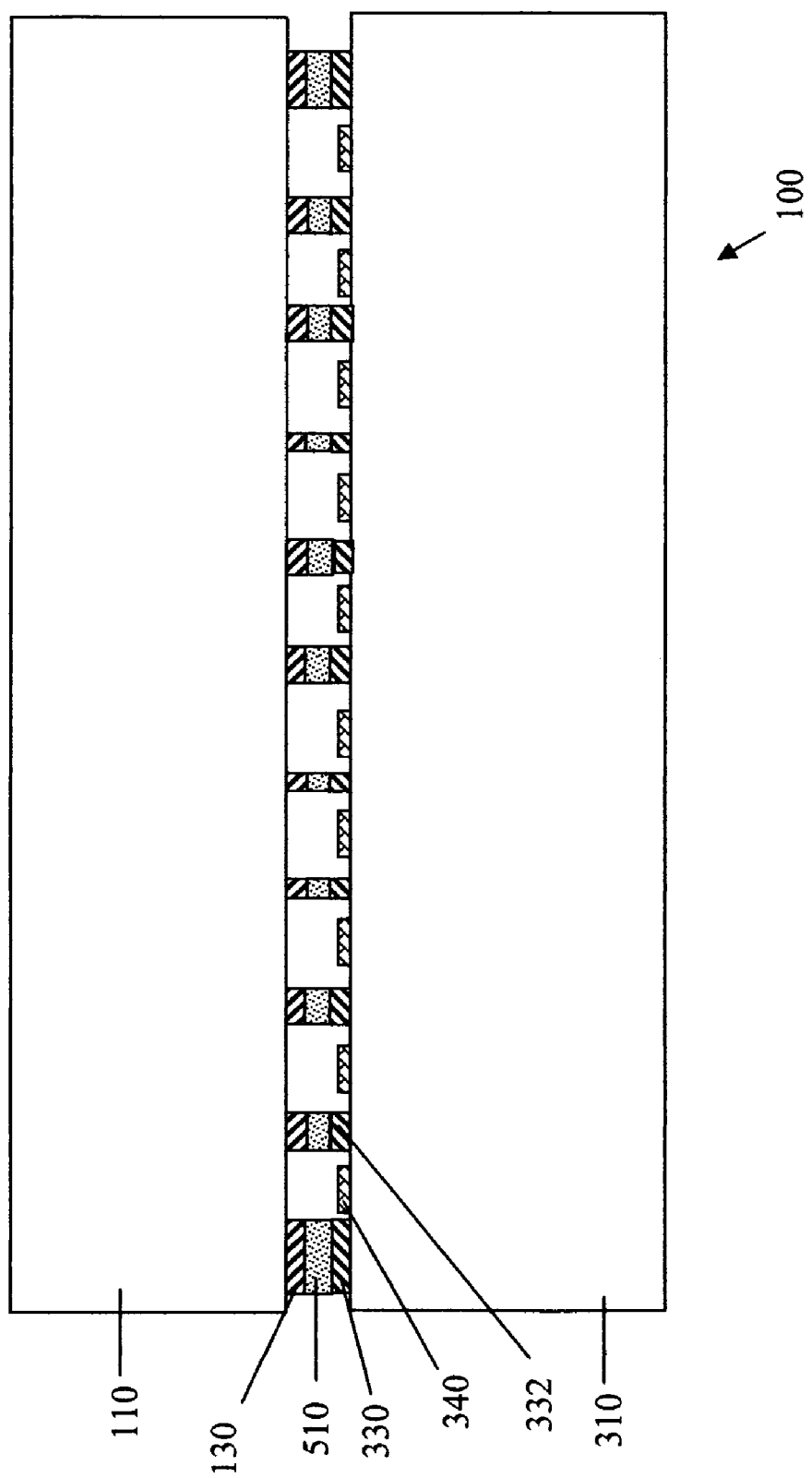
FIG. 3 is a cross sectional view showing an exemplary two-metal hermetic seal after formation of the metal alloy bond.

The material of metal layers 130, 500 and 330 may be chosen such that metal layers 130, 500 and 330 may form an alloy 510, as shown in FIG. 3. The alloy 510 may have a much higher melting point than the material of either metal layer 130, 330 or metal layer 500. The alloy 510 is formed by heating the assembly 100 beyond the melting point of the materials of either or both metal layer 130 and 330 and/or metal layer 500. Since the alloy 510 of metal layer 130 and 330 and metal layer 500 may have a melting point much higher than the original metal material of metal layer 130, 330 or metal layer 500, the alloy 510 may quickly solidify, sealing MEMS devices 340 in a hermetic seal. Exemplary environments which may be sealed in the MEMS cavity by the hermetic seal include substantially thermally or electrically insulating gases, such as $SF_6$, $CCl_2F_2$, $C_2Cl_2F_4$ and $N_2$, and vacuum and partial vacuum. By "substantially insulating," it should be understood that the gas environment has less than 50% of the electrical or thermal conductivity of 1 atmosphere of air at room temperature.

In one exemplary embodiment, the first metal layer 130 and third metal layer 330 are gold (Au) and the second metal layer 500 is indium (In). The thicknesses of the gold layers 130 and 330 to the indium metal layer 500 may be in a ratio of about one-to-one by thickness. Since gold is about four times denser than indium, this ratio ensures that there is an adequate amount of gold in layers 130 and 330 to form the gold/indium alloy $AuIn_x$, where x is about 2, while still having enough gold remaining to ensure good adhesion to the substrates 110 and 310. The gold/indium alloy $AuIn_x$ 510 may have a much higher melting point than elemental indium 500, such that upon formation of the alloy 510, it quickly solidifies, forming the hermetic bond. For example, the melting point of the gold/indium alloy may be 540 degrees centigrade, whereas the melting point of elemental indium is only 156 degrees centigrade.

Gold diffuses slowly into indium at room temperature and will diffuse fully into the indium at a temperature well below the melting temperature making the alloy $AuIn_x$ which will not melt below 400 degrees centigrade. Care may therefore be taken to process and store the assembly at low temperatures to prevent the bond from forming before intended.

Upon heating the assembly 100 to the process temperature exceeding the melting point of indium (156 degrees centigrade), the indium becomes molten. Substrate 110 may then be pressed against substrate 310 in order to encourage the mixing of the molten indium 500 with the gold layers 130 and 330. In order to avoid squeezing all the molten indium out from the bond region by the pressing force, a standoff may define a minimum separation between substrate 110 and substrate 310.

Figure 4:
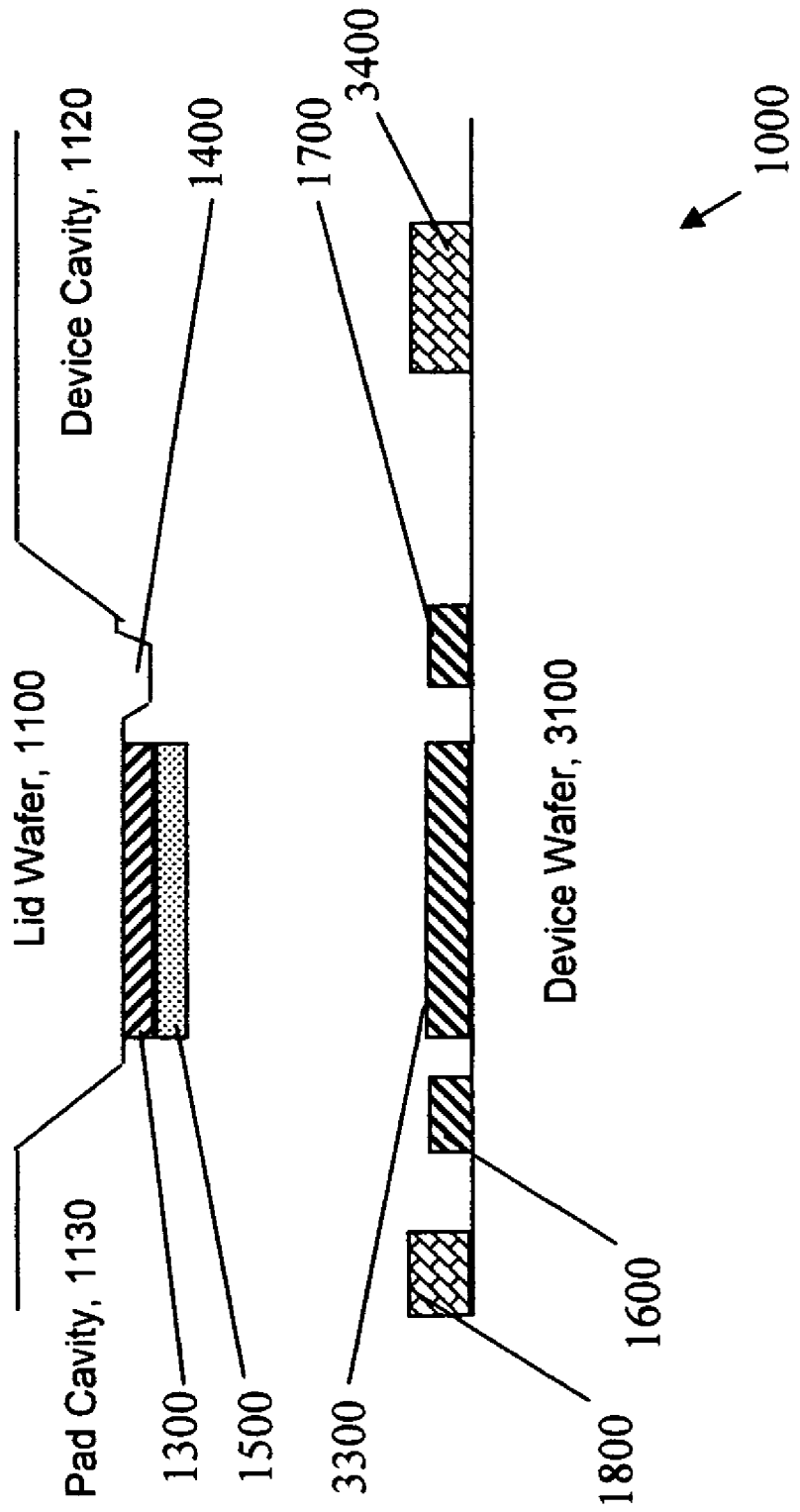
FIG. 4 is a cross sectional view showing a first embodiment of the wafer bond using two metal layers and a standoff on the lid wafer.

FIG. 4 is a cross sectional diagram of a more detailed view of the bond region 1000 of one of the devices similar to that shown in FIG. 2, according to one exemplary embodiment which includes a standoff 1400. The standoff 1400 may be formed in the lid wafer prior to depositing the metal films. The standoff 1400 may be formed by depositing and patterning photoresist over the area corresponding to the standoff, and etching the remaining surface of the lid wafer to a depth of about 2 to about 3 μm. After stripping and re-depositing the photoresist to cover the entire bonding region, the deeper cavities may be etched. These deeper cavities may include the device cavity 1120 and the pad cavity 1130. The device cavity 1120 provides clearance for the MEMS device 3400 to move, whereas the pad cavity 1130 provides clearance for external bonding pads such as pad 1800. Although not shown in this simplified view, the external pad 1800 may provide electrical access to the MEMS device 3400. The pad cavity 1130 over the pad 1800 may provide clearance for later sawing of the lid wafer to expose the bond pad 1800, which allows probing of the device 3400 before it is separated from the device wafer 3100.

After formation of the standoff 1400, the lid wafer 1100 may be plated with the bonding agents, a first layer of a first metal and a second layer of a second metal. In one exemplary embodiment, the lid wafer 1100 is plated with about 2.5 μm of gold 1300, followed by about 4 to about 5 μm of indium 1500. In addition, the device wafer 3100 may be plated with a third layer of the first metal. In this exemplary embodiment, the device wafer 3100 is plated with about 6 μm of gold 3300. It should be understood that the thicknesses disclosed above are exemplary only, and that other thicknesses may be chosen depending on the requirements of the application, as long as the thicknesses are appropriate for the formation of the metal alloy 200. Two additional gold features 1600 and 1700 may be formed at the same time as gold layer 3300. These additional gold features 1600 and 1700 may provide a dam on either side of the bond region, to confine the molten indium and prevent it from either flowing into and interfering with MEMS device 3400 or with external pad 1800. The assembly 1000 may then be heated to about 180 degrees centigrade, in order to melt the indium layer 1500 and form the gold/indium alloy 510. To assist in the formation of the gold/indium alloy 510, the lid wafer 1100 and the device wafer 3100 may be pressed together at a pressure of about 1 atmosphere. The alloy 510 may immediately solidify, forming the hermetic seal around the MEMS device. The assembly 1000 may then be cooled to room temperature.

Figure 5:
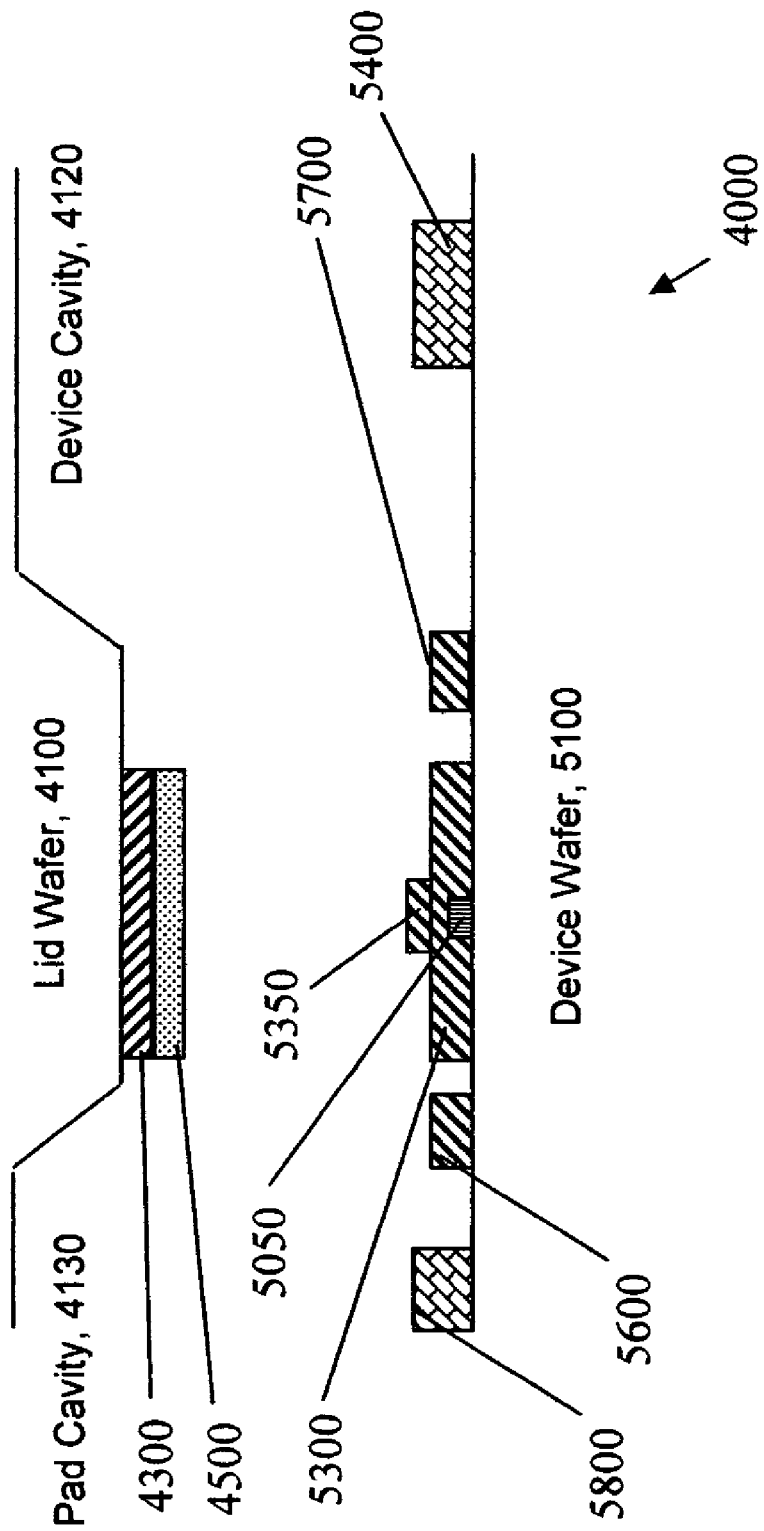
FIG. 5 is a cross sectional view showing a first embodiment of the wafer bond using two metal layers with a raised feature within the bondline on the device wafer.

FIG. 5 shows an exemplary embodiment 4000 which does not use the standoff 1400. Instead, in the embodiment 4000 shown in FIG. 5, a raised feature 5050 is deposited on the device wafer 5100, before deposition of the gold layer 5300. As used herein, the term "raised feature" refers to a feature which protrudes beyond the mating surfaces of the device, establishes a minimum separation between the surfaces of the device wafer 5100 and the lid wafer 4100, and over which at least one bonding agent may be deposited. The presence of raised feature 5050 produces a corresponding raised feature 5350 of the bonding agent, which here is a gold layer 5300, deposited conformally over the surface of the device wafer 5100 and the raised feature 5050. The resulting raised feature 5350 of the gold layer 5300 may enhance the formation of the alloy bond between the two substrates, the device wafer 5100 and the lid wafer 4100, as described further below. A second layer of a second metal, here an indium layer 4500, may be deposited over a third layer of the first metal, here a gold layer 4300. The second layer 4500 and third layer 4300 may be deposited on the second substrate, which here may be the lid wafer 4100.

Figure 6:
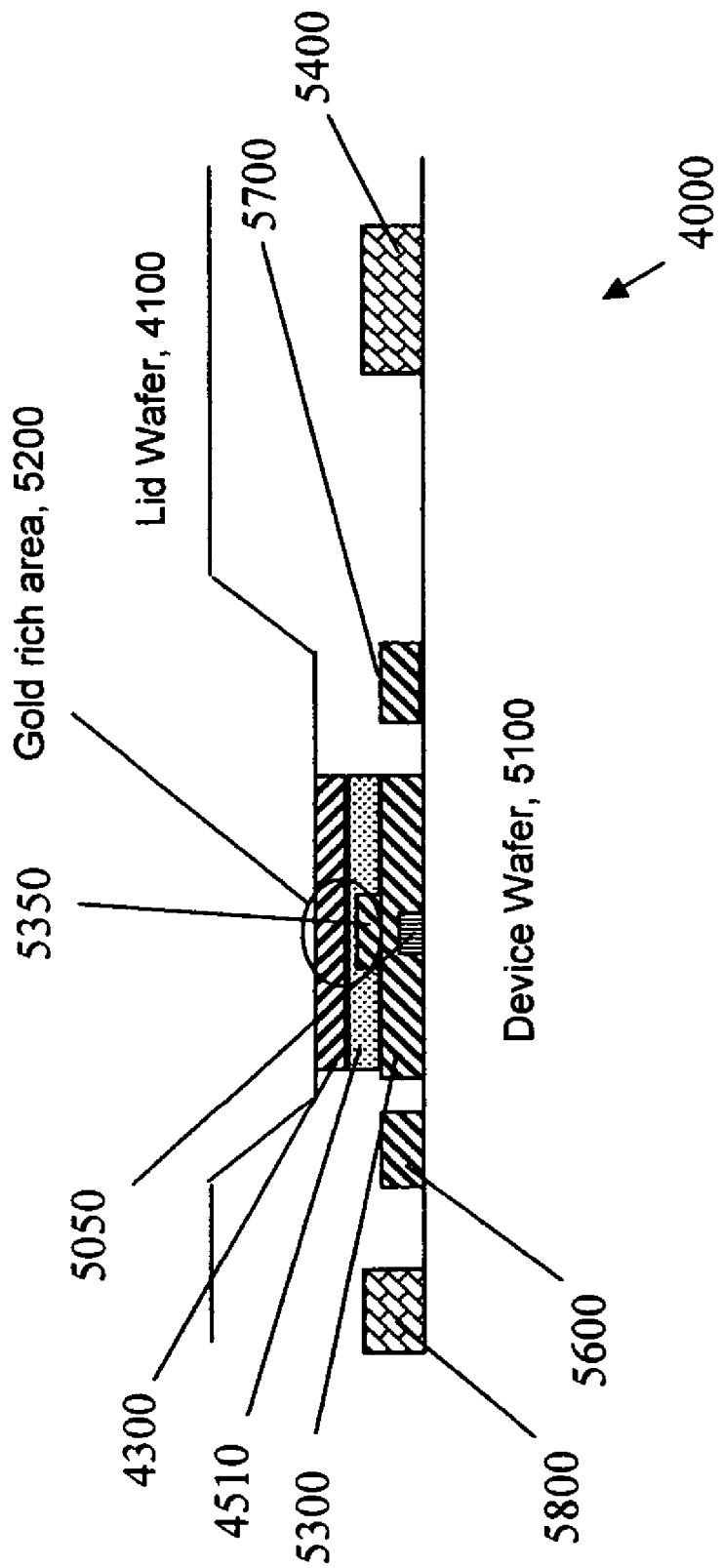
FIG. 6 is a cross sectional view showing a first embodiment of the wafer bond of FIG. 5 after the device wafer and lid wafer are brought together.

As the device wafer 5100 is brought toward the lid wafer 4100 during processing, the raised feature 5350 of the gold layer 5300 penetrates the molten indium layer 4500, until it touches or nearly touches the opposing gold layer 4300. FIG. 6 shows the embodiment of FIG. 5 after the device wafer 5100 and the lid wafer 4100 are brought together, with the raised feature 5350 of the gold layer 5300 penetrating the indium layer 4500. Since the indium layer 4500 is molten, it is free to flow out of the bondline region until the mating surfaces of the device wafer 5100 and the lid wafer 4100 reach the minimum separation defined by the raised feature 5350 in the gold layer 5300. Therefore, the raised feature 5350 may serve the same function as the standoff 1400 in the embodiment shown in FIG. 4.

Since most of the molten indium 4500 may have been squeezed out of the region between the raised gold feature 5350 and the gold layer 4300, this region may form a gold-rich area 5200 for formation of the gold/indium alloy which is likely to have a stoichiometry $AuIn_x$ wherein x is less than 2. In other regions further from the raised gold feature 5350 and gold-rich area 5200, the stoichiometry of the gold/indium alloy may be relatively indium-rich and gold poor, and may be likely to form an alloy $AuIn_x$ wherein x is greater than two. Between these two regions, there is likely to be a region of near-perfect stoichiometry, that is, where the stoichiometry of the alloy is nearly $AuIn_2$, which may be the desired alloy. In this region, the alloy 4510 may form a hermetic seal, sealing the device 5400 from the ambient environment. Therefore, by forming the raised feature 5050 below the metal layer, at least one region of the proper stoichiometry is more likely to form, and thus create the desired hermetic seal.

The profile described above, with a gold-rich region and a gold-poor region, may be symmetric about the centerline of raised features 5050 and 5350, resulting in at least two regions of the proper stoichiometry each adjacent to the gold-rich region 5200, and therefore forming a double seal about the centerline in the example.

The raised feature 5050 may be made of any material which has suitable mechanical competency, that is, a material which maintains its rigidity at a process temperature of about 200 degrees centigrade, and does not otherwise react with the gold or indium. For example, the raised feature 5050 may be formed of a metal such as an earlier plated gold layer, a deposited or plated nickel (Ni) layer, a chromium (Cr), tungsten (W), or titanium (Ti) layer, an inorganic dielectric layer such as silicon dioxide, silicon nitride, poly silicon, amorphous silicon, spin-on glass (SOG), or a spin coated, temperature tolerant polymer layer such as SU8, polyimide, or benzocyclobutene (BCB). In one embodiment, copper (Cu) is deposited by electroplating to a thickness of about 3 μm to about 6 μm. Copper is chosen in this embodiment for convenience, and may be deposited simultaneously with other copper features such as sacrificial layers located beneath the movable MEMS device 5400. In general, the thickness (or height) of the raised feature 5050 may be on the order of the thickness of the second metal layer, here the indium layer 4500, so as to penetrate through or nearly through the second metal layer. In general, the height of the raised feature may be between about 3 μm and about 6 μm tall. For example, the thickness (or height) of the raised feature 5050 may be about 4.8 μm and the thickness of the indium layer about 5.3 μm. The width of the raised feature may be between about one-quarter and about one-half of the width of the metal layers 4300, 4500 and 5300, which form the bondline. In one exemplary embodiment, the width of the raised feature is about 20 μm to about 40 μm, and the width of layer 4500 of the bondline is about 80 to about 150 μm before melting, and the width of metal layers 4300 and 5300 are about 200 μm. The thickness of the first layer of the first metal, here gold layer 5300, may be about 6 μm. The thickness of the second layer of the second metal, here indium 4500, may be about 4 to about 6 μm, and the thickness of the third layer of the first metal, here gold layer 4300, may be about 2.5 μm. The total thickness of the resulting alloy 4510 may be about 4 μm to about 6 μm thick.

The embodiment shown in FIG. 5 may have the advantage that no standoff 1400 needs to be formed on the lid wafer, which eliminates the process steps described above for the formation of this feature. In addition, comparison of FIG. 4 with FIG. 5 reveals that the elimination of the standoff 1400 may also reduce the area on the wafer that must be dedicated to the bonding operation. Also, by assuring the proper stoichiometry of the $AuIn_x$ alloy in at least one two regions, an effective hermetic seal may be formed. In fact, testing of devices made according to the embodiment illustrated in FIG. 5, compared to the embodiment shown in FIG. 4, an improvement in die yield hermeticity from about 80% to about 95% was realized. This improved hermetic seal may be much more resistant to temperature cycling compared to the seal made by the embodiment illustrated in FIG. 4, because the bondline is inherently soft and ductile, and a double seal is formed about the raised feature 5350 centerline. Section photos of the design made according to the embodiment shown in FIG. 6 show cracks that appear to propagate along the length of the bondline at perhaps some undesired stoichiometry. The cracks were not seen to propogate across the raised feature 5350. Since the height of the raised feature 5050 is controlled by sputtering, electroplating, lithographic or other uniform deposition method, the minimum separation between the substrates 4100 and 5100 may be controlled very tightly. Because the height of the raised feature 5050 and 5350 (4.8 μm) is nearly the same as the thickness of the indium layer (5.3 μm), the raised feature may effectively divide the volume of indium, leaving a relatively small volume of residual molten indium between the raised feature 5350 and the gold film 4300, which is susceptible to squeeze-out from between the bondlines. This smaller squeeze-out volume may make the bonding operation more reliable and more repeatable.

To further confine the flow of indium, the embodiment in FIG. 5 may also have a pair of gold features 5600 and 5700 on either side of the bond line, which serve as dams to impede the flow of molten indium into the device cavity 4120 or the pad cavity 4130 areas. These features may perform a function similar to features 1600 and 1700 in the exemplary embodiment shown in FIG. 4.

Figure 7:
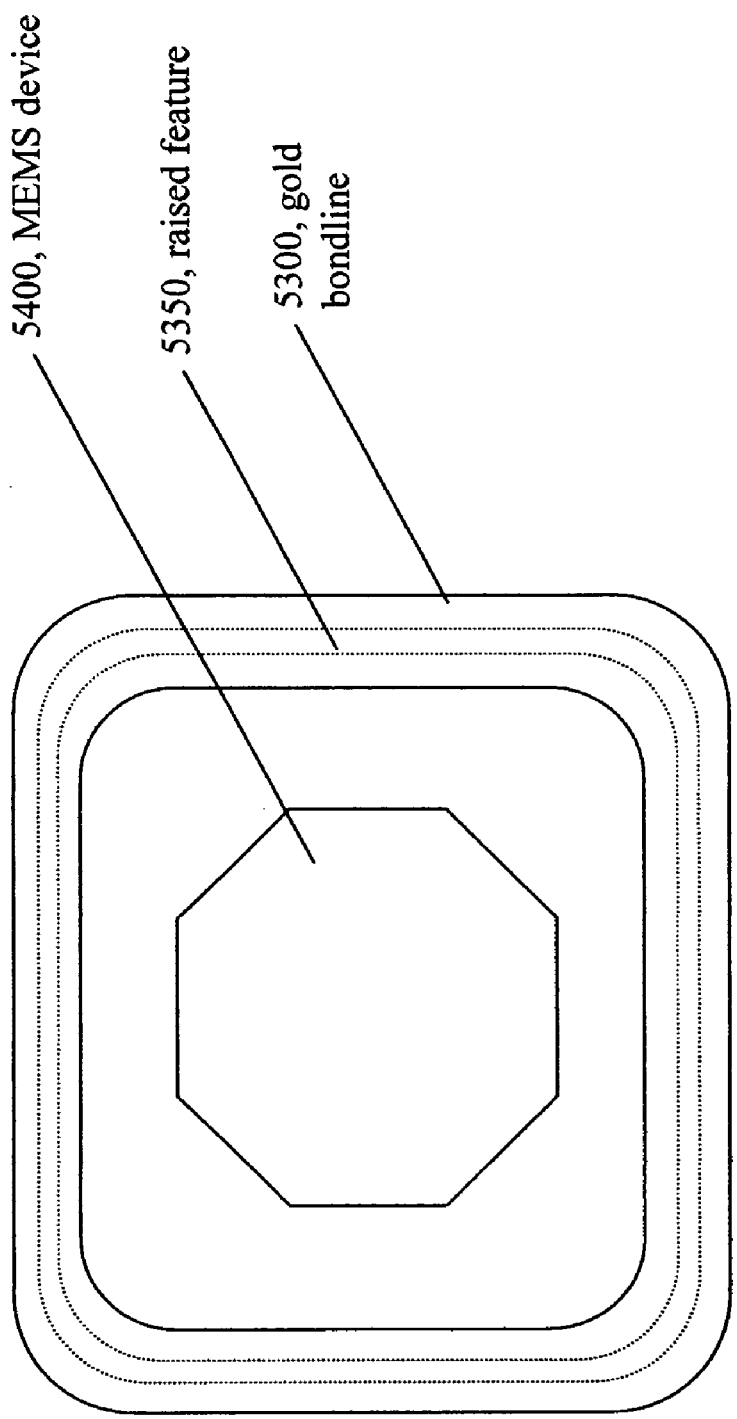
FIG. 7 is a plan view showing the first exemplary embodiment of the wafer bond using two metal layers with a raised feature on the device wafer.

FIG. 7 shows a plan view of the exemplary embodiment shown in cross section in FIG. 5. As shown in FIG. 6, the raised feature may completely circumscribe the MEMS device 5400 as a continuous perimeter. Alternatively, the raised features may only exist in certain portions around the perimeter of the device, such as in a series of raised pads or protrusions rather than a raised line. Raised pads rather than a raised line completely circumscribing the device may have the advantage that the gases are free to enter and exit the device cavity during fabrication. This may be convenient, as the pressure differential across the raised features may be allowed to equilibrate before the hermetic seal is made, and the desired gas may be allowed to completely replace the ambient gas around the MEMS device 5400 before sealing.

Figure 8:
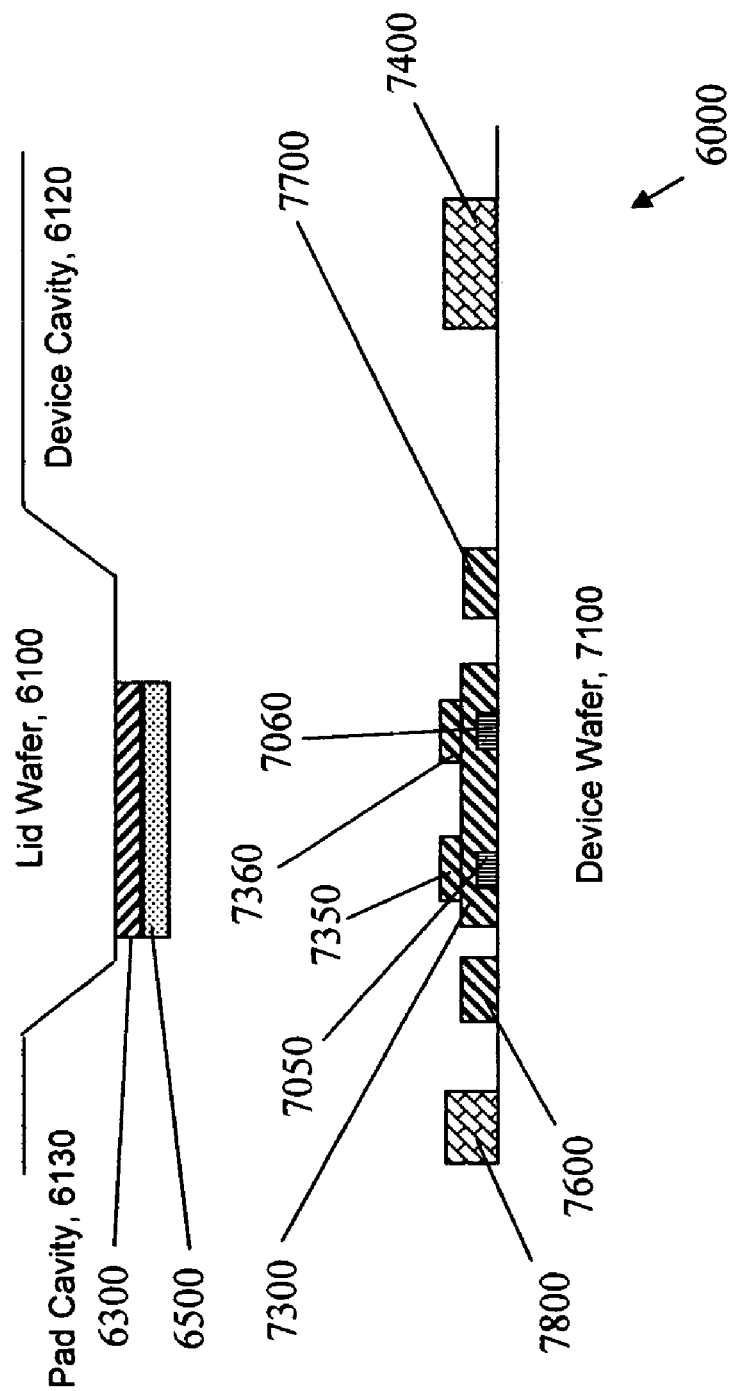
FIG. 8 is a cross sectional view showing a second embodiment of the wafer bond using two metal layers with a raised feature within the bondline on the device wafer.

FIG. 8 shows a second embodiment 6000 of the metal alloy hermetic seal using the raised features. As shown in FIG. 8, there may be more than one raised feature around the perimeter of the device, such as the two raised features 7050 and 7060. Like the first embodiment shown in FIGS. 5 and 6, the raised features 7050 and 7060 may be formed of a sacrificial material, which may be, for example, copper electroplated on the surface of the device wafer 7100. The presence of raised features 7050 ad 7060 cause two corresponding raised features, 7350 and 7360 to be formed upon deposition of the conformal gold layer 7300 over the raised features 7050 and 7060. As before, the bondline may include another electroplated gold layer, 6300, as well as an electroplated indium layer 6500. Although two raised features 7050 and 7060 are shown in FIG. 8, it should be understood that this is exemplary only, and that any number of additional raised features may be used. Also, it should be understood that the raised features may completely circumscribe the device as shown in FIG. 7, or the raised features may be distinct, and form, for example, a series of raised protrusions. Also as before, two additional gold features 7600 and 7700 may serve as dams to block the flow of molten indium into the device cavity 6120 or the pad cavity 6130. As with the previous embodiments, the raised features 7350 and 7360 may penetrate the layer of molten indium 6500, to provide at least two locations for each raised feature wherein the ratio of gold to indium is the preferred 1 to 2, to form the preferred alloy, $AuIn_2$.

Figure 9:
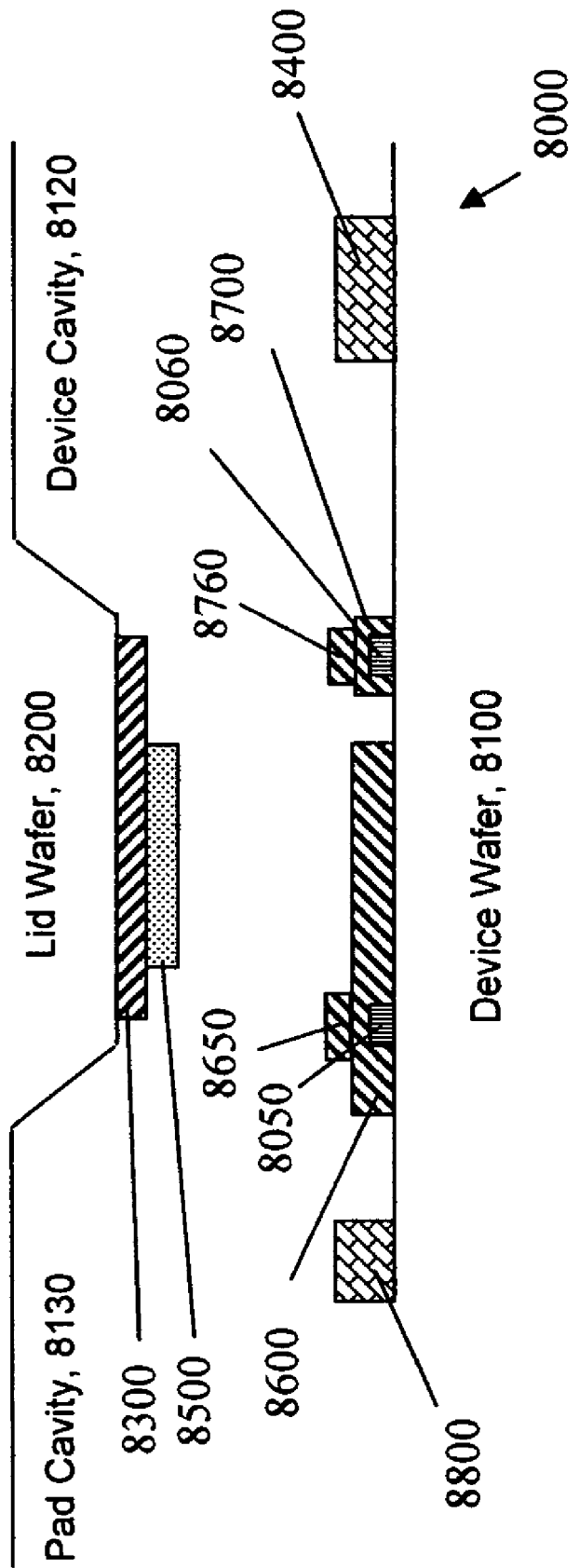
FIG. 9 is a cross sectional view showing a third exemplary embodiment of the wafer bond using two metal layers with a raised feature within the bondline on the device wafer.

FIG. 9 shows a third exemplary embodiment 8000 of the metal alloy bond with raised features. In this embodiment, the raised features 8050 and 8060 are located outside of the indium layer, and therefore do not penetrate the indium layer as in the first and second embodiments. As with the previous embodiments, layers of gold 8600 and 8700 are deposited over each of the raised features 8050 and 8060, respectively, to form raised gold features 8650 and 8760, respectively. Because these raised gold features 8650 and 8760 are located outside the indium layer 8500, the raised features 8650 and 8760 provide only dams which impede the flow of the molten indium beyond the bondline region and into the device cavity 8120 or external bond cavity 8130, as well as the standoffs which define the minimum separation between the device wafer 8100 and the lid wafer 8200. Although this embodiment may not provide the improved bonding properties of the first two embodiments, it still reduces the wafer area devoted to bonding the device wafer 8100 with the lid wafer 8200, by locating the standoffs, that is, gold features 8650 and 8760 within the bondline. Because it also provides the mechanical standoff function, it therefore eliminates the process steps required to produce the standoff ring 1400 on the lid wafer in the embodiment without the raised features, shown in FIG. 4.

Figure 10:
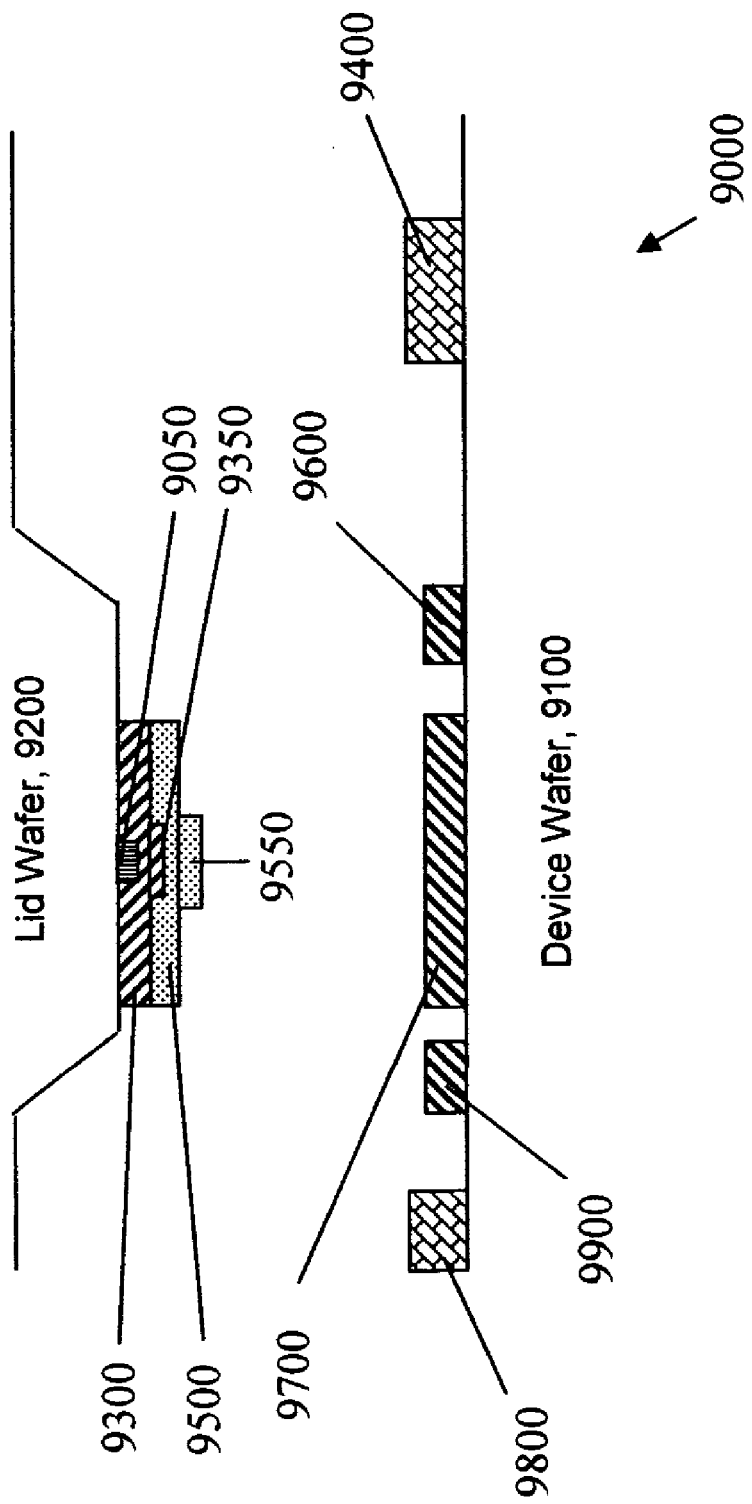
FIG. 10 is a cross sectional view showing a fourth embodiment of the wafer bond using two metal layers with a raised feature within the bondline on the lid wafer.

FIG. 10 shows a fourth embodiment 9000 of the metal alloy bond with the raised feature. In the fourth embodiment 9000, the raised feature 9050 is placed on the lid wafer 9200, rather than the device wafer 9100. In this embodiment, all the other aspects of the design, such as layer thicknesses, and widths of the raised feature may be the same as in the first embodiment illustrated in FIG. 5. In addition, there may be a plurality of raised features formed on the lid wafer 9200, rather than just the one shown in FIG. 10. The presence of the raised feature 9050 then causes a raised feature 9350 to be formed in the overlying gold layer 9300, and then a corresponding raised feature 9550 to be formed in the indium layer 9500 deposited over the gold layer 9300 and raised feature 9350 on the lid wafer 9200. When the indium layer 9500 becomes molten during processing and the device wafer 9100 is pressed against the lid wafer 9200, the raised feature 9350 of the gold layer 9300 protrudes through the molten indium 9500, until it touches or nearly touches the gold layer 9700 deposited on the device wafer 9100. Therefore, the raised gold feature 9350 performs a similar function to the raised feature 5350 in FIG. 5, that is, to put two gold-rich regions in close proximity to each other by penetrating the molted indium layer, thereby creating a spectrum of stoichiometries from gold-rich to indium-rich/gold poor. The raised feature 9050 thereby helps to ensure that there are at least two regions symmetric about each raised feature within the spectrum of stoichiometries, wherein the ratio of gold-to-indium is appropriate for forming the preferred stoichiometric alloy, $AuIn_2$. This region may form the hermetic seal around the MEMS device.

Figure 11:
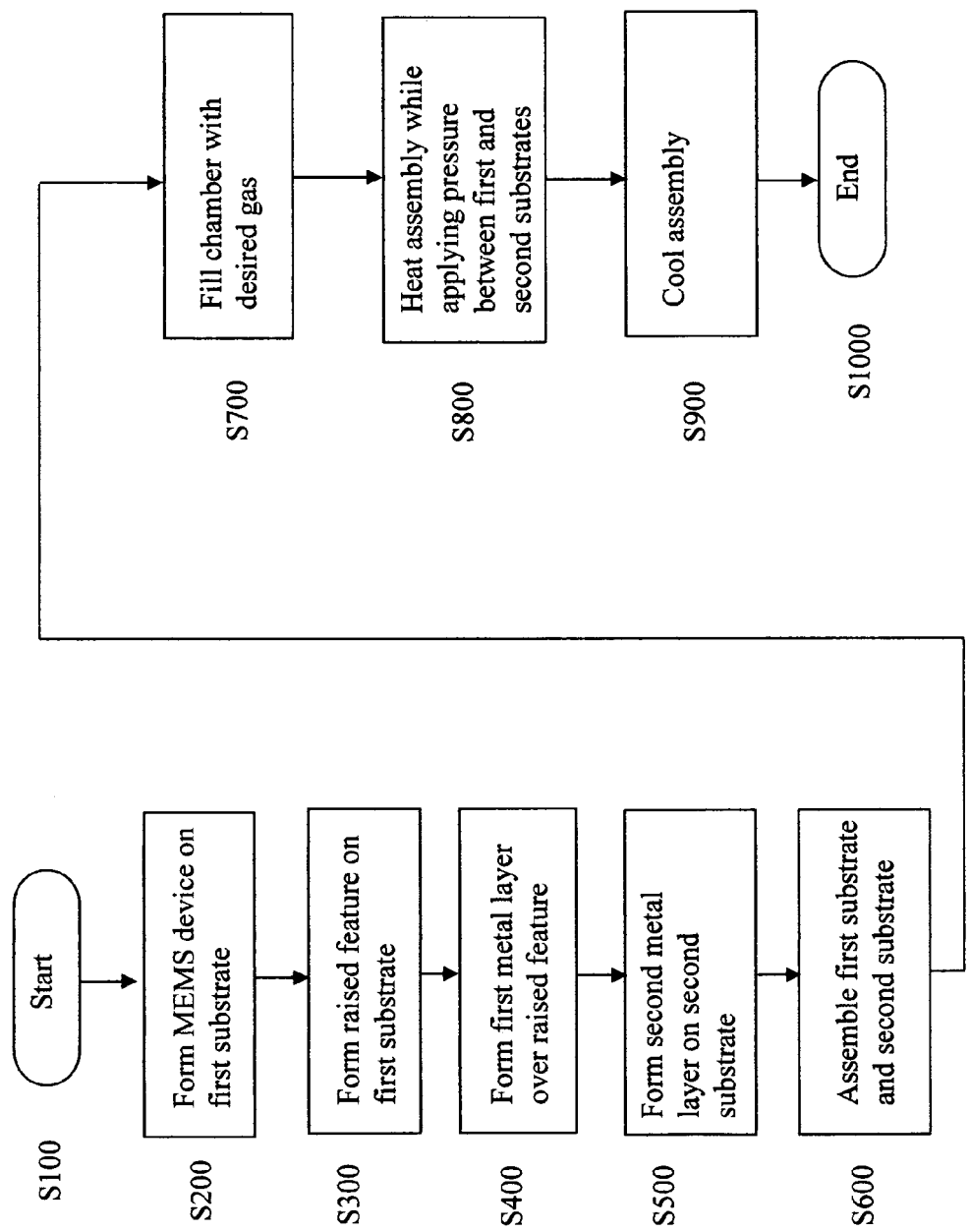
FIG. 11 is an exemplary embodiment of a method for manufacturing an encapsulated MEMS device with metal alloy hermetic seal using a raised feature under the bondline.

FIG. 11 illustrates an exemplary embodiment of a method for manufacturing the encapsulated MEMS device. The method begins in step S100 and proceeds to step S200, wherein the MEMS device is formed on a first substrate. In step S300, a raised feature is also formed on the first substrate. While the method shown in FIG. 10 has the raised feature formed after the MEMS device, it should be understood that the raised feature may be formed simultaneously with, or even before, the MEMS device, or whenever it may conveniently be implemented in the process, before the metal layers are deposited and the substrates are bonded. In various exemplary embodiments, the raised feature is made of copper which is electroplated on the first substrate. In step S400, a first metal layer is formed over the raised feature. In step S500, a second and third metal layer is formed on the second substrate. In various exemplary embodiments, the second substrate may be a lid wafer comprising, for example, amorphous silicon, crystalline silicon, glass, quartz, sapphire or metal.

In step S600, the first substrate is assembled with the second substrate by, for example, disposing their mating surfaces against one another. In step S700, a chamber containing the assembled substrates is filled with the desired environment. Exemplary environments include gases which are at least one of thermally insulating and electrically insulating, such as $SF_6$, He, $CCl_2F_2$, $C_2Cl_2F_4$ and $N_2$, vacuum and partial vacuum.

In step S800, the assembly is heated while applying pressure between the first and the second substrates. In step S900, the assembly is cooled to form the hermetic seal around the MEMS device. The process ends in step S10000.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, while the disclosure describes the formation of a gold/indium alloy, it should be understood that the systems and methods described herein may be applied to any number of different alloy systems in addition to $AuIn_x$. Furthermore, while a specific number of raised features is described in the exemplary embodiments, it should be understood that other numbers of raised features may be chosen, depending on the application. Although a method is disclosed for manufacturing the encapsulated MEMS device, it should be understood that this method is exemplary only, and that the steps need not be performed in the order shown, and may be adapted to produce any embodiment described herein or other embodiments encompassed. Accordingly, the exemplary implementations set forth above, are intended to be illustrative, not limiting.

What is claimed is:

1. An encapsulated device with a hermetic seal, comprising:
    a device formed on one of a first substrate and a second substrate;
    a raised feature protruding from a surface of at least one of the first substrate and the second substrate, and disposed substantially in a perimeter around the device; and
    an alloy disposed over and around the at least one raised feature, wherein the alloy couples the first substrate to the second substrate with a substantially hermetic seal to encapsulate the device and wherein the raised feature is disposed at about a midpoint across a width of the alloy.

2. The encapsulated device of claim 1, wherein the alloy comprises a first metal and a second metal, and a layer of the first metal is disposed on one of the first and the second substrate.

3. The encapsulated device of claim 1, wherein the raised feature defines at least one of a continuous perimeter and a series of raised protrusions around the device.

4. The encapsulated device of claim 1, wherein the raised feature protrudes from the surface of at least one of the first substrate and the second substrate by about 3 μm to about 6 μm.

5. The encapsulated device of claim 4, wherein the first layer is about 6 μm thick and the alloy is between about 4 μm and about 6 μm thick.

6. The encapsulated device of claim 1, wherein the second substrate is at least one of amorphous silicon, crystalline silicon, glass, quartz, sapphire, and metal.

7. The encapsulated device of claim 1, further comprising:
an environment hermetically encapsulated with the device, the environment being at least one of substantially thermally insulating and substantially electrically insulating.

8. The encapsulated device of claim 7, wherein the environment comprises at least one of $SF_6$, He, $CCl_2F_2$, $C_2Cl_2F_4$ and $N_2$, vacuum and partial vacuum.

9. The encapsulated device of claim 8, wherein the environment is at a pressure of greater than 1 atmosphere.

10. The encapsulated device of claim 1, wherein the alloy comprises $AuIn_x$, wherein x is about 2.

11. The encapsulated device of claim 1, wherein the first substrate is electrically coupled to the second substrate through the alloy, such that the alloy makes electrical contact with both the first substrate and the second substrate.

12. The encapsulated device of claim 1, wherein an additional raised feature protrudes from a surface of at least one of the first substrate and the second substrate, and is disposed substantially in a second perimeter around the device, and wherein the alloy is formed over and around the additional raised feature.

13. The encapsulated device of claim 1, wherein the at least one raised feature comprises an electroplated, spin coated or deposited material comprising one from the group of gold, nickel, chromium, copper, tungsten, titanium, silicon dioxide, silicon nitride, poly silicon, amorphous silicon, spin-on-glass, photoresist, polyimide and benzocyclobutene.

14. The encapsulated device of claim 1, wherein the alloy has regions of ranging stoichiometry, adjacent the raised feature.

15. The encapsulated device of claim 1, wherein the alloy includes regions of $AuIn_x$ wherein x=2, and also includes regions of $AuIn_x$ wherein x<2.

16. The encapsulated device of claim 1, wherein the alloy also includes regions of $AuIn_x$ wherein x>2.

17. The encapsulated device of claim 1, wherein the raised feature is disposed within the alloy, such that the alloy exists above and adjacent to the raised feature.

18. The encapsulated device of claim 1, wherein the alloy is disposed on top of and against at least one side of the raised feature, and forms a continuous perimeter around the encapsulated device.

19. The encapsulated device of claim 2, wherein a second layer of the first metal is disposed on another of the first substrate and the second substrate, and over the raised feature.

* * * * *